United States Patent
Sano et al.

(10) Patent No.: US 6,628,363 B1
(45) Date of Patent: Sep. 30, 2003

(54) THIN FILM TRANSISTOR HAVING A COVERED CHANNEL AND DISPLAY UNIT USING THE SAME

(75) Inventors: Keiichi Sano, Gifu (JP); Yasuo Segawa, Gifu (JP); Norio Tabuchi, Ichinomiya (JP); Tsutomu Yamada, Gifu (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 09/324,138

(22) Filed: Jun. 2, 1999

(30) Foreign Application Priority Data

Jun. 3, 1998 (JP) .......................................... 10-154835

(51) Int. Cl.⁷ .......................................... G02F 1/1343
(52) U.S. Cl. .......................................... 349/151; 349/43
(58) Field of Search .......................... 349/42, 43, 44, 349/45, 151; 257/59, 72

(56) References Cited

U.S. PATENT DOCUMENTS

| | | | |
|---|---|---|---|
| 5,200,846 A | | 4/1993 | Hiroki et al. |
| 5,495,353 A | * | 2/1996 | Yamazaki et al. ............. 349/43 |
| 5,499,123 A | | 3/1996 | Mikoshiba |
| 5,548,153 A | | 8/1996 | Muragishi |
| 5,576,857 A | * | 11/1996 | Takemura .................... 349/42 |
| 5,644,146 A | | 7/1997 | Arai et al. |
| 5,712,494 A | * | 1/1998 | Akiyama et al. ............. 257/59 |
| 5,754,261 A | | 5/1998 | Lyu |
| 5,784,132 A | | 7/1998 | Hashimoto |
| 5,796,116 A | | 8/1998 | Nakata et al. |
| 5,834,797 A | | 11/1998 | Yamanaka |
| 5,926,234 A | * | 7/1999 | Shiraki et al. ................. 349/40 |
| 5,946,059 A | * | 8/1999 | Yamazaki et al. ............. 349/43 |
| 5,955,765 A | | 9/1999 | Yamazaki et al. |
| 5,965,916 A | | 10/1999 | Chen |
| 5,966,193 A | | 10/1999 | Zhang et al. |
| 5,990,491 A | | 11/1999 | Zhang |
| 6,034,747 A | | 3/2000 | Tanaka et al. |

FOREIGN PATENT DOCUMENTS

JP 5-72562 3/1993

OTHER PUBLICATIONS

Japanese Office Action Notice of Grounds for Rejection, Patent Ser. NO. HEI 10–154835.

* cited by examiner

*Primary Examiner*—Kenneth Parker
(74) *Attorney, Agent, or Firm*—Cantor Colburn LLP

(57) ABSTRACT

A circuit having a CMOS configuration in which n-type and p-type thin film transistors are connected in a complementary manner to one another is employed as a drive circuit of a display or the like. The n-type and p-type thin film transistors have common gate electrodes and drain electrodes, with respective source electrodes being connected to difference power sources, thereby providing a complementary connection structure. A source electrode of that one of the n-type thin film transistor and the p-type thin film transistor that is subjected for a longer period of time to an off voltage, applied to the shared gate electrode, for turning that transistor off, is extended in such a manner as to overlap a channel formation region of the corresponding thin film transistor. This present a variation in characteristic of the thin film transistor.

23 Claims, 11 Drawing Sheets

THIN FILM TRANSISTOR HAVING A COVERED CHANNEL AND DISPLAY UNIT USING THE SAME

BACKGROUND OF THE INVENTION

1. Field of the Invention

The present invention relates to a thin film transistor (hereinafter referred to as "TFT") having an interlayer insulating film and to a display using the TFT as a switching element.

2. Description of the Prior Art

Recent development is directed toward TFTs which use a polycrystalline silicon film as an active layer and which are used as a driver element and/or a pixel driving element for an active matrix type liquid crystal display (hereinafter referred to as "LCD") or an organic EL (Electro Luminescence) display.

A conventional TFT is described hereinbelow.

FIG. 1 is a block configuration diagram of a typical LCD.

As shown in the diagram, the LCD comprises a display part provided with TFTS for driving display pixels and a drive circuit for driving the TFTs of the display part, the drive circuit including a scanning side drive circuit 10 and a horizontal side drive circuit 20.

The scanning side drive circuit 10 is provided with a vertical side shift register 11 and a buffer array 12, while the horizontal side drive circuit 20 is provided with a horizontal side shift register 21, a buffer array 22 and a source line switch array 23.

FIG. 2 is a TFT top plane view of a buffer constituting the conventional horizontal side drive circuit 20. FIG. 3 is a sectional view taken along a line 2A—2A of FIG. 2.

Referring to FIG. 3, the structure of the TFT of the buffer is described.

On an insulating substrate 510 made of quartz glass or non-alkaline glass, there are formed in the mentioned order a gate electrode 511 made of a refractory metal (high melting point metal) such as chromium (Cr) or molybdenum (Mo), gate insulating film 512 and an active layer 513 made of a polycrystalline silicon film.

The active layer 513 is provided with channels 515 and 516 positioned over the gate electrode 511 and with sources 518 and 521 and drains 519 and 520 which are positioned on both sides of the channels 515 and 516 and which are formed by ion implantation with stoppers 517 serving as masks on the channels 515 and 516. In FIGS. 2 and 3, the TFT on the right of the diagrams is an n-type channel TFT in which impurity ions of phosphorus (P) or the like are doped into the source 518 and the drain 519, whereas the TFT on the left of the diagram is a p-type channel TFT in which impurity ions of boron (B) or the like are doped into the source 521 and the drain 520.

Then, on top of all the surfaces of the gate insulating film 512, active layer 513 and stopper 517 there are formed an interlayer insulating film 522 consisting of an $SiO_2$ film, a SiN film and an $SiO_2$ film which are placed in this order. Metal such as Al is then filled into contact holes provided correspondingly to the sources 518 and 521 and the drains 519 and 520 to thereby form source electrodes 27 and 25 and a drain electrode 24. In this case, the drain electrode 24 connected to the drains 519 and 520 are shared by the n-type channel TFT and the p-type channel TFT. On top of all the surfaces there is further formed a planarization film 26 made of, e.g., organic resin for making the surfaces planar. An inverter 500 consisting of the n-type channel TFT and the p-type channel TFT is thus formed. Another inverter 400 also has the same structure.

Liquid crystal is then filled into the cell gap between the substrate provided with the horizontal side drive circuit including inverters 400 and 500, the vertical side drive circuit and the display pixels, and the substrate confronting the above substrate, to thereby obtain an LCD.

In the conventional TFT, however, impurities from the sealing adhesive occurring upon the positioning to join the two substrates together or impurity ions occurring in the TFT manufacturing steps, may adhere to the top or bottom of the planarization insulating film of the TFT to be charged, with the result that a back channel may be formed in the TFT, causing a variation in the threshold voltage of the TFT. Disadvantageously, this resulted in an increase of the current consumption.

SUMMARY OF THE INVENTION

The present invention has been conceived in view of the conventional drawbacks described above. It is therefore the object of the present invention to provide a TFT having a stable threshold voltage as well as a display capable of suppressing an increase in the current consumption, by preventing impurities or other foreign matter from adhering to the top or bottom of the planarization insulating film of the TFT, or even in the case that electric charges are generated.

A TFT of the present invention comprises, on an insulating substrate, a gate electrode, a gate insulating film, a semiconductor film provided with an n-type channel and a source and a drain, an interlayer insulating film, a first electrode connected to the source of the semiconductor film, a second electrode to which a higher voltage than a voltage applied to the first electrode is applied and which is connected to the drain, and a planarization insulating film, said first electrode being disposed in such a manner as to overlap at least the n-type channel.

The above gate electrode is subjected mainly to a relatively low voltage.

A TFT of the present invention comprises, on an insulating substrate, a gate electrode, a gate insulating film, a semiconductor film provided with a p-type channel and a source and a drain, an interlayer insulating film, a first electrode connected to the drain of the semiconductor film, a second electrode subjected to a higher voltage than the voltage applied to the first electrode, the second electrode being connected to the source of the semiconductor film, and a planarization insulating film, wherein the second electrode is disposed in such a manner as to overlap at least the p-type channel.

Further, the above gate electrode is subjected mainly to a relatively high voltage.

A thin film transistor according to another aspect of the present invention comprises a gate electrode, a gate insulating film, a semiconductor film provided with a channel and a source and a drain, an interlayer insulating film, a source electrode connected to the source, and a drain electrode connected to the drain, wherein the source electrode is extended in such a manner as to overlap a channel formation position.

This thin film transistor may employ a configuration in which the channel is a n-type channel, with the gate electrode being subjected to a low level voltage acting as an off voltage for a long period of time.

This thin film transistor may also employ a configuration in which the channel is a p-type channel, with the gate electrode being subjected to a high level voltage acting as an off voltage for a long period of time.

The above thin film transistor can be a bottom gate type transistor having its gate electrode formed under the semiconductor film, with its source electrode covering the top of the channel with the interlayer insulating film therebetween. Alternatively, the above TFT can also be a top gate type transistor having its gate electrode formed over the semiconductor film, with its source electrode extending in such a manner as to cover the top area of the channel of the interlayer insulating film covering the gate electrode and semiconductor film.

In those configurations, according to a further aspect of the present invention, a planarization insulating layer is provided for covering the interlayer insulating film, the source electrode and the drain electrode to thereby flatten the surface.

The thin film transistor subjected to an off voltage for a long period of time is liable to suffer from a variation in characteristics of current and voltage. Thus, by configuring at least the thin film transistor driven in such a condition so that its channel overlaps the source electrode, it is possible to prevent an occurrence of a back channel as a result of accumulation of electric charge attributable to the impurity ions which may invade during the element forming process or upon the production of the display. Further, in spite of possible accumulation of electric charge, the source electrode serves to electrically shield the channel region. This makes it possible to prevent an increase of leakage current at a gate bias of 0 V by the characteristic shift of the thin film transistor.

According to a further aspect of the present invention there is provided a circuit comprising a n-type thin film transistor and a p-type thin film transistor, the n-type thin film transistor including a gate electrode, a gate insulating film, a semiconductor film provided with a n-type channel and a source and a drain, an interlayer insulating film, a source electrode connected to the source, and a drain electrode connected to the drain, the p-type thin film transistor including a gate electrode, a gate insulating film, a semiconductor film provided with a p-type channel and a source and a drain, an interlayer insulating film, a source electrode connected to the source, and a drain electrode connected to t the drain, wherein the n-type thin film transistor and the p-type thin film transistor share the gate electrode and the drain electrode, with respective source electrodes being connected to different power sources to provide a complementary connection structure, and wherein the source electrode of either the n-type thin film transistor or the p-type thin film transistor, that is, whichever one is subjected for a longer period of time to an off voltage, applied to the shared gate electrode, for turning that transistor off, extends in such a manner as to overlap a channel formation region of corresponding thin film transistor.

The above n-type and p-type thin film transistors of the above circuit can be a bottom gate type thin film transistor or a top gate type thin film transistor.

In such a so-called CMOS structure circuit, a voltage for turning the transistor off is applied to the shared gate electrode of either of the n-type and p-type thin film transistors which are connected to each other in a complementary manner. Then, in particular, the thin film transistor subjected to the off voltage for a longer period of time may be very likely to suffer from a characteristic variation due to the occurrence of a back channel. Thus, by electrically protecting the channel region by the source electrode of the present invention, the variation in characteristics can be reliably prevented.

According to a yet further aspect of the present invention, the above thin film transistor is used as an element of a display.

Further, according to a still further aspect of the present invention there is provided a display having a plurality of pixels which are arranged in a matrix manner and which are controlled for display, wherein a channel of either n-type or p-type thin film transistors connected in a complementary manner to at least a drive circuit for feeding a display signal to each pixel among drive circuits of the display, that is, a channel of either n-type or p-type thin film transistor having at least gate electrodes subjected for a longer period of time to a voltage for turning those transistors off, extends in such a manner as to overlap the source electrode with the interlayer insulating film therebetween.

In a flat display such as a liquid crystal display or an organic electroluminescence (EL) display, arrangement is such that switching elements (thin film transistors) of the display part and a drive circuit for driving the switching elements are formed on the same substrate. In such a case, the drive circuit often employs the CMOS structure of thin film transistors having the same configuration as the display thin film transistors. Variations in characteristics of the thin film transistors constituting the drive circuit may act directly on the display quality of the display. In the case of a drive circuit (e.g., a horizontal drive circuit) which feeds a display signal to each pixel in particular, the variations in characteristics may have a significant influence on the characteristics of the unit due to its rapid operation speed. It is therefore very important to prevent the variations in characteristics of the thin film transistors of the drive circuit.

Further, in the case of employing the CMOS structure, one of the n-type and p-type thin film transistors is necessarily turned off upon operation of the unit, so that the transistors having a longer off state are liable to suffer from characteristic variations due to the occurrence of a back channel.

In the process for building the display, formation of the thin film transistors precedes rubbing on the planarization insulating film and enclosure of liquid crystal material in the case of the liquid crystal display or the formation of the EL element part in the case of the organic EL display, all of which may increase the possibility allowing the invasion of impurity ions causing accumulation of electric charge.

In such a situation, the present invention is arranged such that with respect to the transistor having a longer off state among the CMOS structured transistors, a channel and a source electrode thereof overlap each other so that the channel is electrically shielded by the voltage of the source electrode, thereby securely and effectively hindering a back channel liable to occur without causing any increase in the production steps, to consequently achieve a secure prevention of variations of characteristics of the thin film transistors.

According to the present invention as described above, it is possible to prevent impurities from adhering to the top of the TFTs (e.g., on the planarization insulating film) and to impede a shift of characteristics of the TFT attributable to the undesired adhesion. It is also possible to provide TFTs having stabilized threshold voltage and to suppress an increase in the current consumption. Further, use of such TFTs in the display achieves prevention of increase in current consumption of the unit as well as a satisfactory display.

DESCRIPTION OF THE PREFERRED EMBODIMENTS

A TFT of the present invention will be described hereinbelow.

Figure 4:
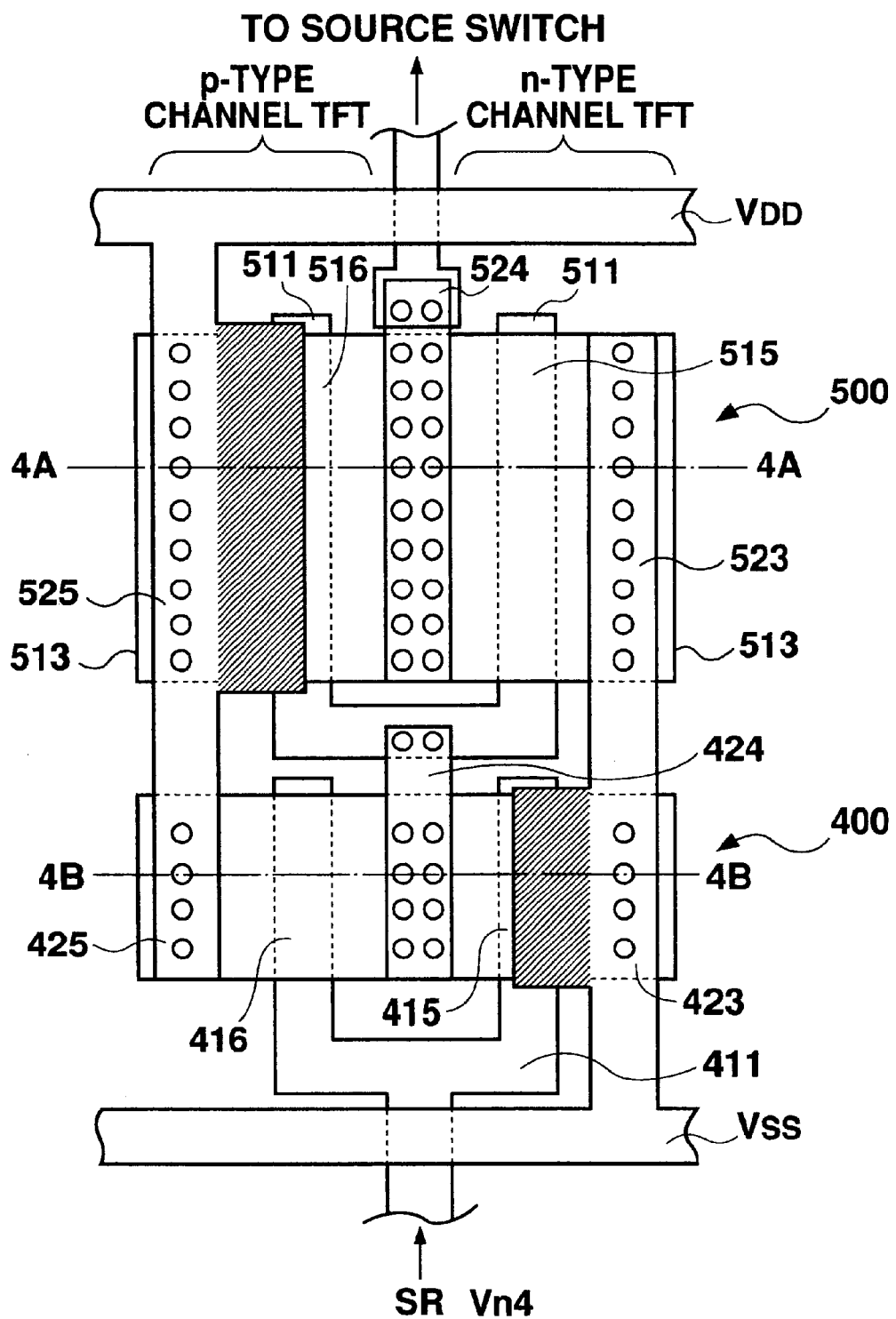
FIG. 4 is a diagram showing a TFT top plan configuration of a buffer circuit according to an embodiment of the present invention.
Figure 5A:
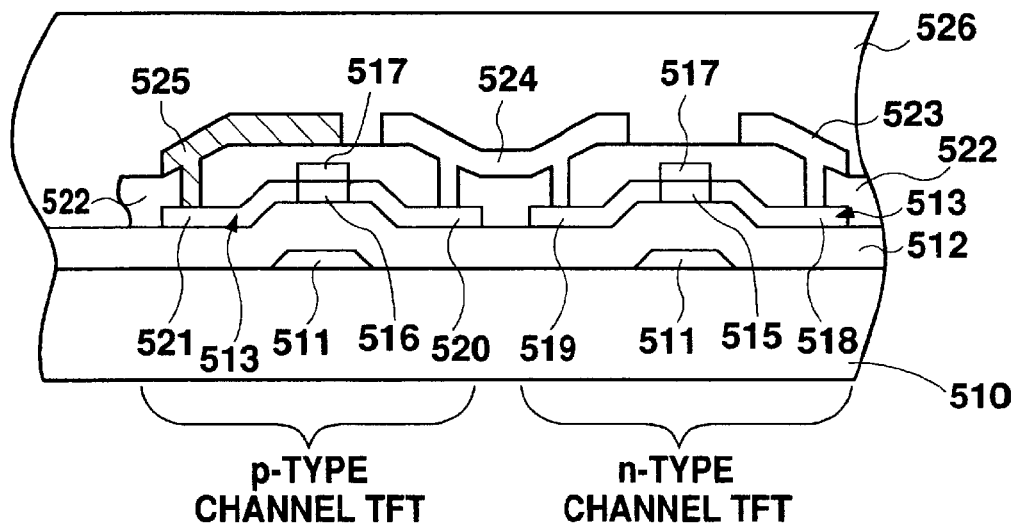
FIG. 5A is a diagram showing a TFT sectional configuration of the buffer circuit taken along a line 4A—4A of FIG. 4.
Figure 5B:
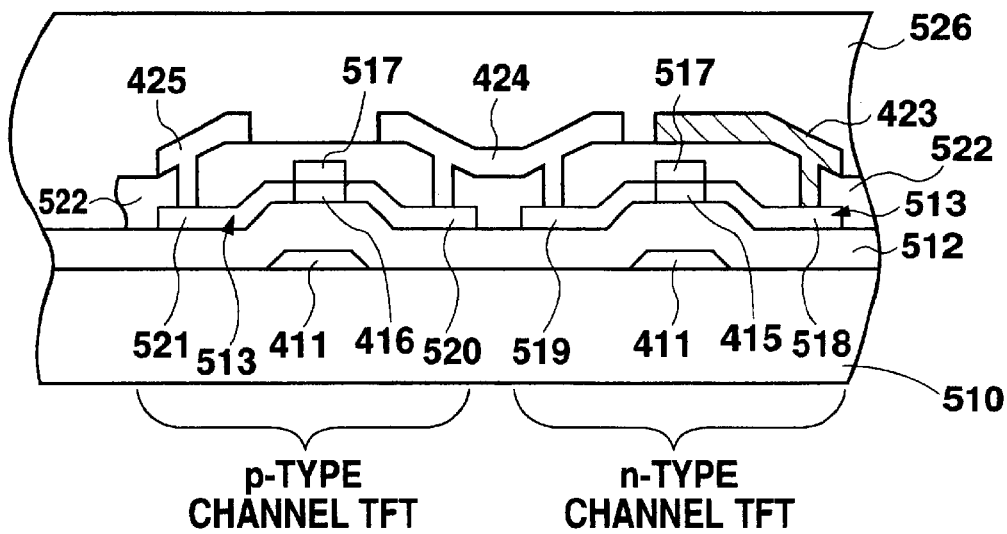
FIG. 5B is a diagram showing a TFT sectional configuration of the buffer circuit taken along a line 4B—4B of FIG. 4.

FIG. 4 shows a TFT plane view of a buffer (inverters 400 and 500) constituting a horizontal side drive circuit of the present invention. FIG. 5A is a sectional view taken along a line 4A—4A of FIG. 4, and FIG. 5B is a sectional view taken along a line 4B—4B of FIG. 4.

A structure of the TFT is described with reference to FIG. 5A.

Figure 1:
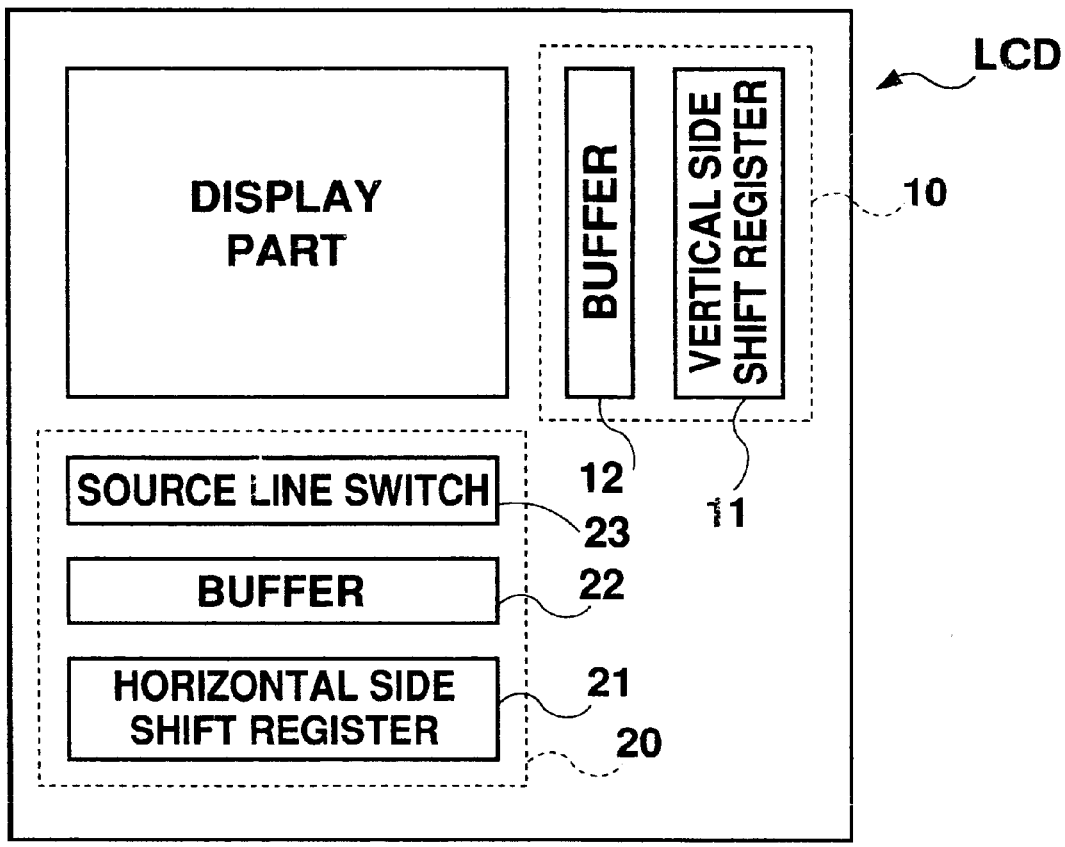
FIG. 1 is a diagram showing a block configuration of a typical LCD.
Figure 2:
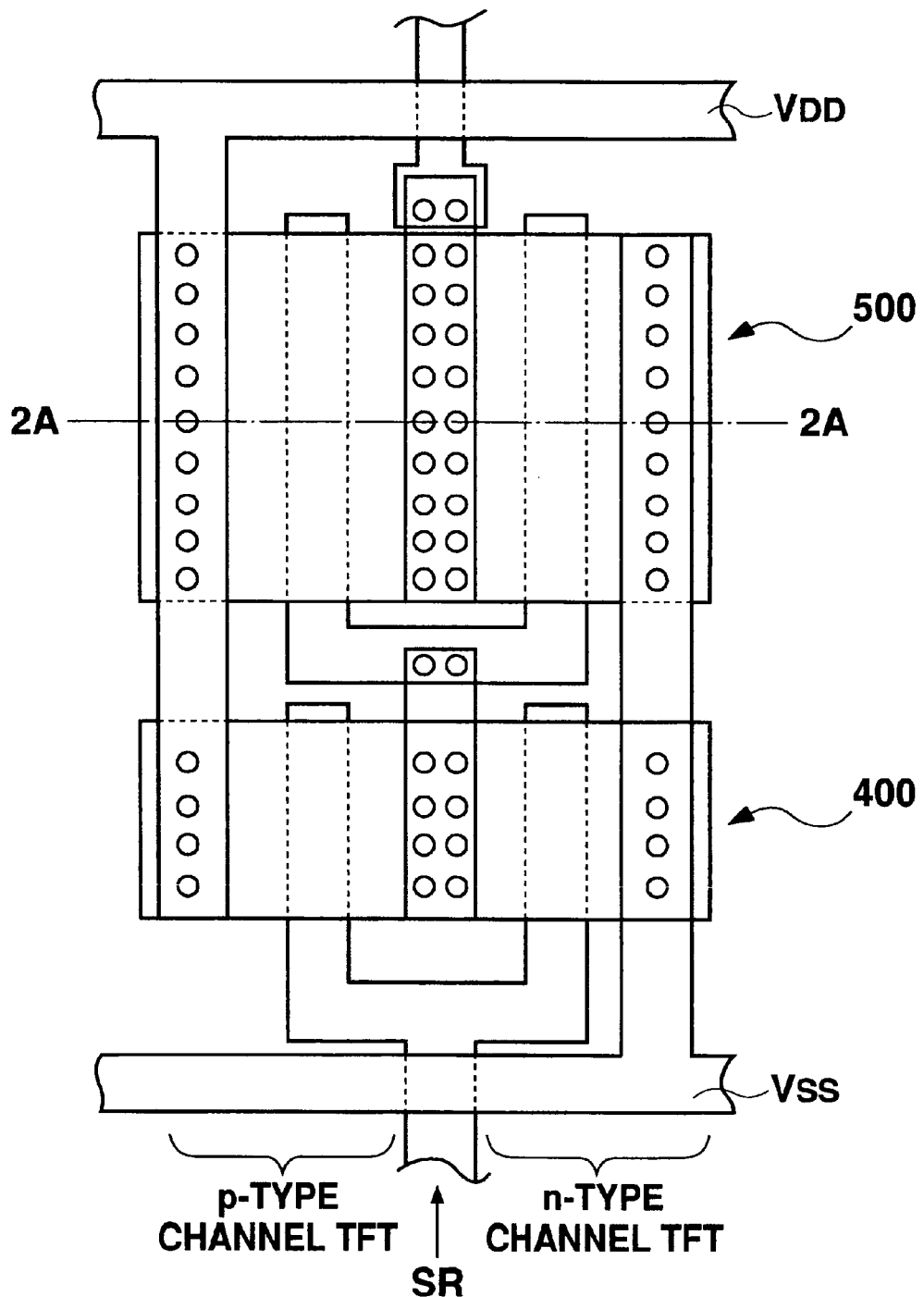
FIG. 2 is a diagram showing a top plane configuration of a conventional buffer circuit.
Figure 3:
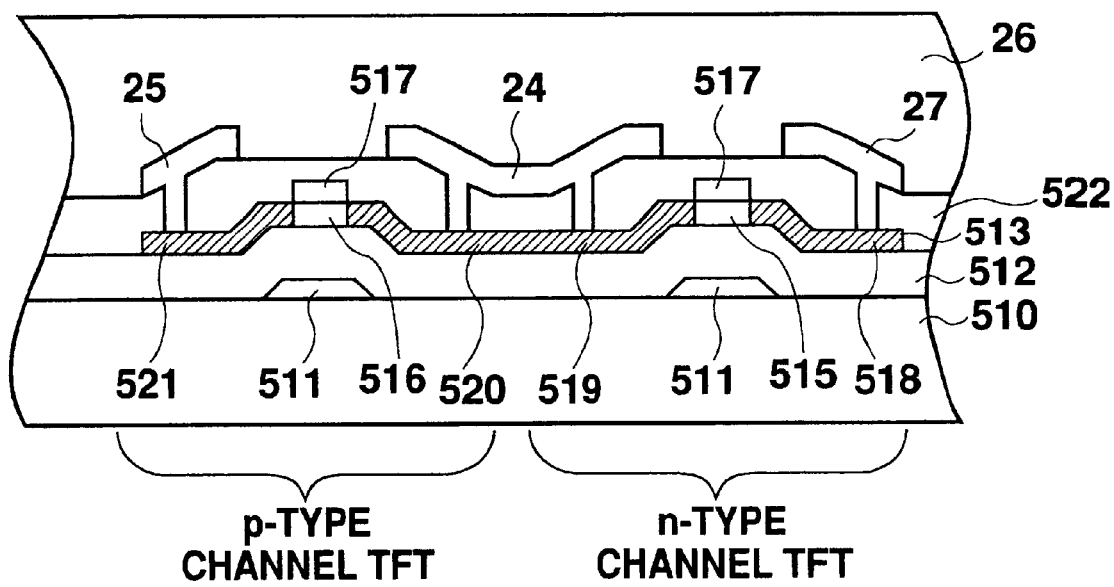
FIG. 3 is a diagram showing a sectional configuration taken along a line 2A—2A of the conventional buffer circuit shown in FIG. 2.

Among the TFT formation steps, the process from the step of forming a gate electrode 511 made of a high-melting point metal (refractory metal) such as Cr or Mo on an insulating substrate 510 made of quartz glass, non-alkaline glass, etc., to the step of forming an interlayer insulating film 522 is common to the TFT formation process shown in FIG. 3, and hence parts common to those in FIG. 3 are designated by the same reference numerals.

Al or other metal is filled into contact holes in an interlayer insulating film 522 provided corresponding to sources 518 and 521 and drains 519 and 520 to form source electrodes 523 and 525 and a drain electrode 524. The drain electrode 524 connected to the drains 519 and 520 is used for both the n-type channel TFT and p-type channel TFT.

At that time, the source electrode 525 of the p-type channel TFT on the left side in the diagram extends over the interlayer insulating film 522 so as to cover the top of a channel 516 (hatched area in FIG. 4). This results in a structure in which the source electrode 525 is superposed via the interlayer insulating film 522 on top of the channel 516 of the p-type channel TFT. The inverter 400 has the same 1X structure, although in the inverter 400 as shown in FIG. 5B, a source electrode 423 of the n-type channel TFT in place of a source electrode 425 of the p-type channel TFT extends over a channel 415 (hatched area in FIG. 4).

Over the entire surface there is further formed a planarization insulating film 526 made of, e.g., organic resin for planarization the surface. The inverters 400 and 500 are thus formed having a connected in a complementary manner CMOS structure in which the n-type and p-type channel TFTs have common or mutually connected gate electrodes and drains, with each source electrode being connected to a different power source.

In such a configuration, due to formation of the source electrode 525 over the p-type channel 516 of the inverter 500 and to formation of the source electrode 423 over the n-type channel 415 of the inverter 400, adhesion of impurities or the like and variations in TFT threshold voltage of the inverters 500 and 400 are prevented. Furthermore, in the case of adhesion of impurities or the like, the area corresponding to the channel is electrically shielded, so that the characteristic shift of TFT is controlled. The increase in the current consumption is thus prevented.

Each signal of the horizontal side drive circuit will now be described.

Figure 6:
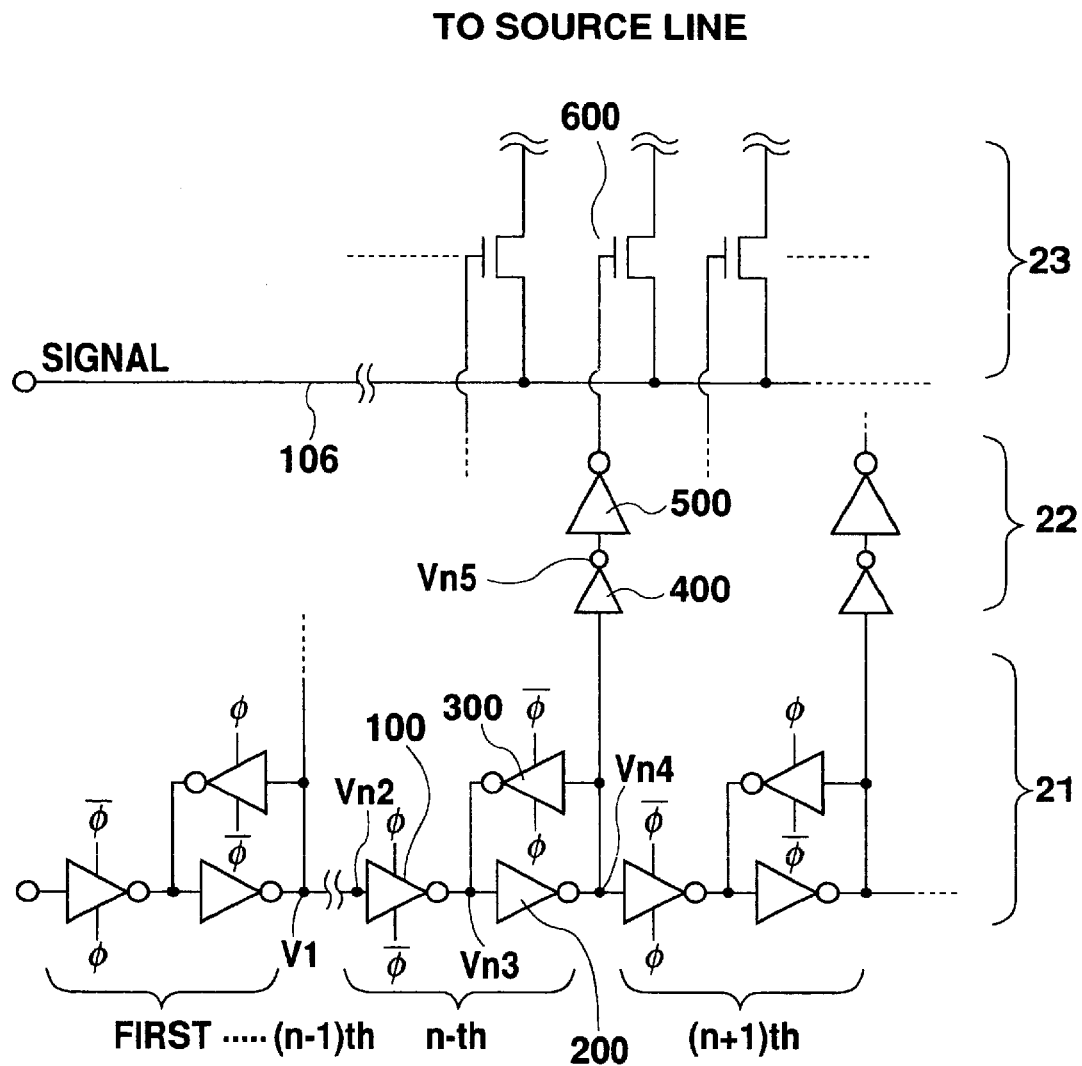
FIG. 6 is a diagram showing a partially equivalent circuit configuration of a horizontal drive circuit according to the embodiment of the present invention.
Figure 7:
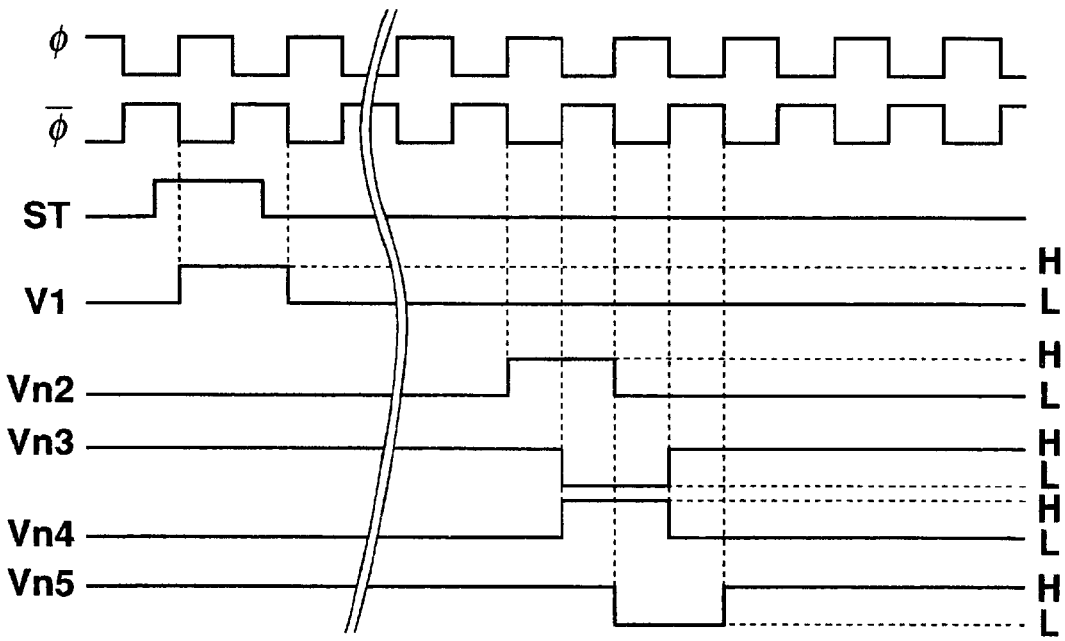
FIG. 7 is a timing chart of signals for driving the horizontal drive circuit according to the embodiment of the present invention.

FIG. 6 shows a partially equivalent circuit of the horizontal side drive circuit, and FIG. 7 shows a timing chart of each signal of the horizontal side drive circuit. In FIG. 6, reference numeral 21 denotes a shift register, 22 a buffer, and 23 a source line switch.

A first shift register is activated by a start pulse ST and clocks $\phi$ and $\bar{\phi}$ ($\bar{\phi}$ means a signal obtained by inverting the clock $\phi$), and then a second shift register is activated by an output signal issued from the first shift register.

In a n-th shift register, a horizontal shift register comprises a clocked inverter 100 which receives as its input signal a pulse Vn2 from the preceding (n−1)th shift register, an output inverter 200 receiving as its input signal the output Vn3 of the inverter 100, and a return clocked inverter 300 receiving as its input signal the output Vn4 of the inverter 200. The output Vn4 of the output inverter is also fed to a subsequent (n+1)th shift register and to a n-th buffer 22. The buffer 22 consists of a buffer input stage inverter 400 and a source line switch output side inverter 500. The output signal Vn5 of the inverter 400 is fed to the inverter 500. The source line switch 23 is in the form of a switch (TFT in this case) 600 which performs its switching action in accordance with the output from the buffer 22, through which an image signal 106 is fed to the source line of the display.

Attention is paid herein to the signal of the abovedescribed buffer circuit 22.

As shown in FIG. 4 described above, the buffer 22 is provided with the inverters 400 and 500, the voltage $V_{DD}$ being supplied to the source electrodes 425 and 525 on the side of respective inverter p-type channel TFTs, and the voltage $V_{SS}$ being supplied to the source electrodes 423 and 523 on the side of the respective n-type channel TFTs. For example, the voltage $V_{DD}$ is 15V and voltage $V_{SS}$ is 0V.

A signal Vn4 from the shift register SR is fed to the gate electrode 411 of the inverter 400 consisting of the n-type channel TFT and the p-type channel TFT. If the thus fed signal is low or at a low voltage L, then the p-type channel TFT is turned on so that the voltage $V_{DD}$ is applied from the drain electrode 424 to the gate electrode 511 of the inverter 500, whereas when the fed signal is high or at a high voltage H, then the n-type TFT is turned on so that the voltage $V_{SS}$ is input from the drain electrode 424 to the gate electrode 511 of the inverter 500.

With respect to the inverter 500 consisting of the n-type channel TFT and the p-type channel TFT, when the input signal Vn5 from the inverter 400 is the voltage $V_{SS}$, then the p-type channel TFT of the inverter 500 is turned on so that the voltage $V_{DD}$ is applied to the source line switch 23, whereas when the input signal Vn5 is the voltage $V_{DD}$, then the n-type channel TFT of the inverter 500 is turned on so that the voltage $V_{SS}$ is applied to the source line switch 23.

Incidentally, when attention is paid to e.g., the signal input to the inverter 400 constituting the buffer, that is, to the output signal Vn4 of the shift register shown in FIG. 7, it can be seen that for the greater part (e.g., about 64 $\mu$sec) of the driving period of the inverter 400 the signal is low or at a low voltage L and that the signal is high or at a high voltage H for only a part of the driving period (e.g., about 1 $\mu$sec). On the contrary, when attention is paid to the signal Vn5 input to the inverter 500, it can be seen that the signal is at low voltage L for only a part (e.g., about 1 $\mu$sec) of the driving period of the inverter 500 and that for the greater part of it the signal is at a high voltage H.

In this manner, the high voltage H is applied to the inverter 400 for only a certain short period of time, but for most of the time the low voltage L is applied thereto. In other words, the inverter 400 (the gate electrode 411 of the inverter 400) primarily receives signals at a low voltage L. Under such conditions, the characteristics of the n-type channel TFT of the inverter 400 are subjected to a significant variation in characteristics which will be described later.

Likewise, a low voltage L is applied to the inverter 500 during only a short period of time but a high voltage H is applied thereto for most of the time. In other words, the inverter 500 (the gate electrode of the inverter 500) primarily receives signals at a high voltage H. Thus, in the same manner as the n-type channel TFT in the inverter 400, the p-type channel TFT of the inverter 500 is subjected to a significant variation in characteristics.

Figure 8:
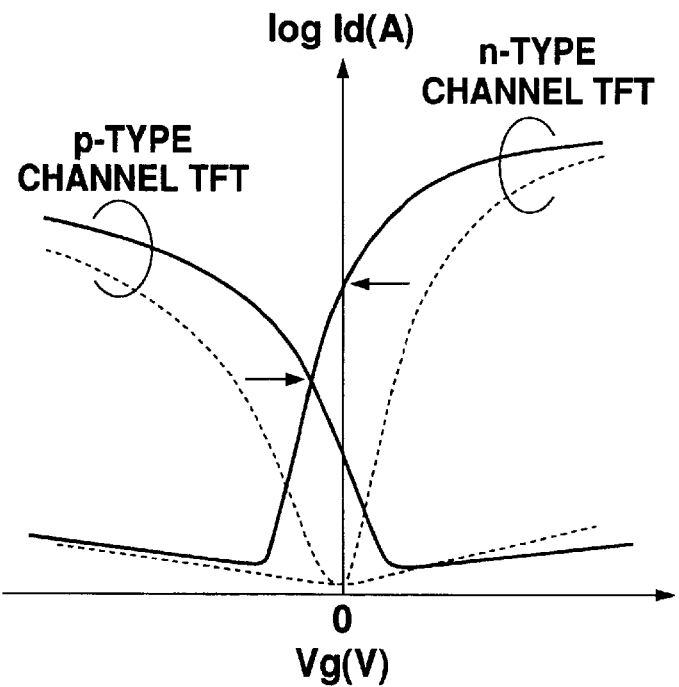
FIG. 8 is a diagram showing a Vg-Id characteristic in the n-type and p-type thin film transistors of the present invention.

FIG. 8 shows Vg-Id characteristics of the n-type and p-type channel TFTs. In the graph, a dotted line represents the initial characteristic and a solid line represents the state of variation in characteristic which has occurred as a result of supply of power.

As can be seen from the graph, during the initial stage, no leakage current flows in either the n-type or p-type channel TFTs when the gate voltage Vg is 0 V. Once the power is supplied, impurities or the like will adhere on the top or bottom of the planarization insulating film so that electric charge is accumulated thereon as described above. As a result, the characteristic of the n-type channel TFT will shift to the negative direction of the gate potential but the characteristic of the p-type channel TFT will shift to the positive direction of the gate potential, whereupon in both cases a leakage current will flow with Vg=0 V. In particular, a remarkable variation will appear in the threshold voltage of the p-type channel TFT when a high voltage H is mainly applied but in the threshold voltage of the n-type channel TFT when a signal at a low voltage L is mainly applied. The variation will result in an increased current consumption in the drive circuit. This is attributable to the fact that a back channel will form in the conventional TFT since the top or bottom of the planarization insulating film of the TFT is subjected to adhesion of impurities from the seal adhesive which may be produced when the adhesive is applied to both substrates and set therein or to impurity ions or the like which may be produced during the TFT manufacturing process, so that electric charge is accumulated. Furthermore, if, during the supply of power, a gradient occurs in bias between the source and drain, the impurity ion will readily move, resulting a remarkable variation as described above.

However, by covering the top of the channel with electrodes as in this embodiment, it is possible to restrict the impurities from seal adhesive which may be produced when the adhesive is applied to both substrates of the LCD and is set therein, or the impurity ions which may be produced during the TFT manufacturing process, from adhering to the surface of the planarization film of the TFT. In particular, it is possible to prevent accumulation of electric charge due to impurity ions during the supply of power to the gate and to prevent the resultant shift of the TFT characteristic.

Description will now be given of the voltage of the electrode to be superposed on the channel.

In the case that the electrode to be superposed on the channel is in a floating state, no stable voltage will be obtained with a variation in the TFT characteristic. Thus, a fixed voltage may be set although new wiring must be provided for the application of voltage to this electrode. In such a case, however, an area for providing the wiring is needed, resulting in an increased area of the drive circuit.

Therefore, this embodiment employs a configuration in which the channel region of the TFT is covered by the source electrode. This means that the voltage applied to the source electrode is fed to the channel region. In the case of an n-type channel TFT for example, if a higher voltage than the source voltage (e.g., voltage $V_{SS}$) is applied to this electrode to be superposed on the channel, then a back channel of the TFT will form, which will bring about an increase in the leakage current. On the contrary, in case of a p-type channel TFT, if a lower voltage than the source voltage (e.g., voltage $V_{DD}$) is applied to the electrode to be superposed on the as channel, then a leakage current will increase in the same manner as the n-type channel TFT. Thus, by providing the source electrode so as to be superposed on the channel in each type of TFT, no back channel will form with no increase of leakage current. Accordingly, the variation in characteristic attributable to the adhesion of impurities due to power supply is suppressed and a reduction in power consumption of the TFT can be achieved.

The present invention will be described by way of a case where it is applied to a shift register of the horizontal drive circuit.

Figure 9:
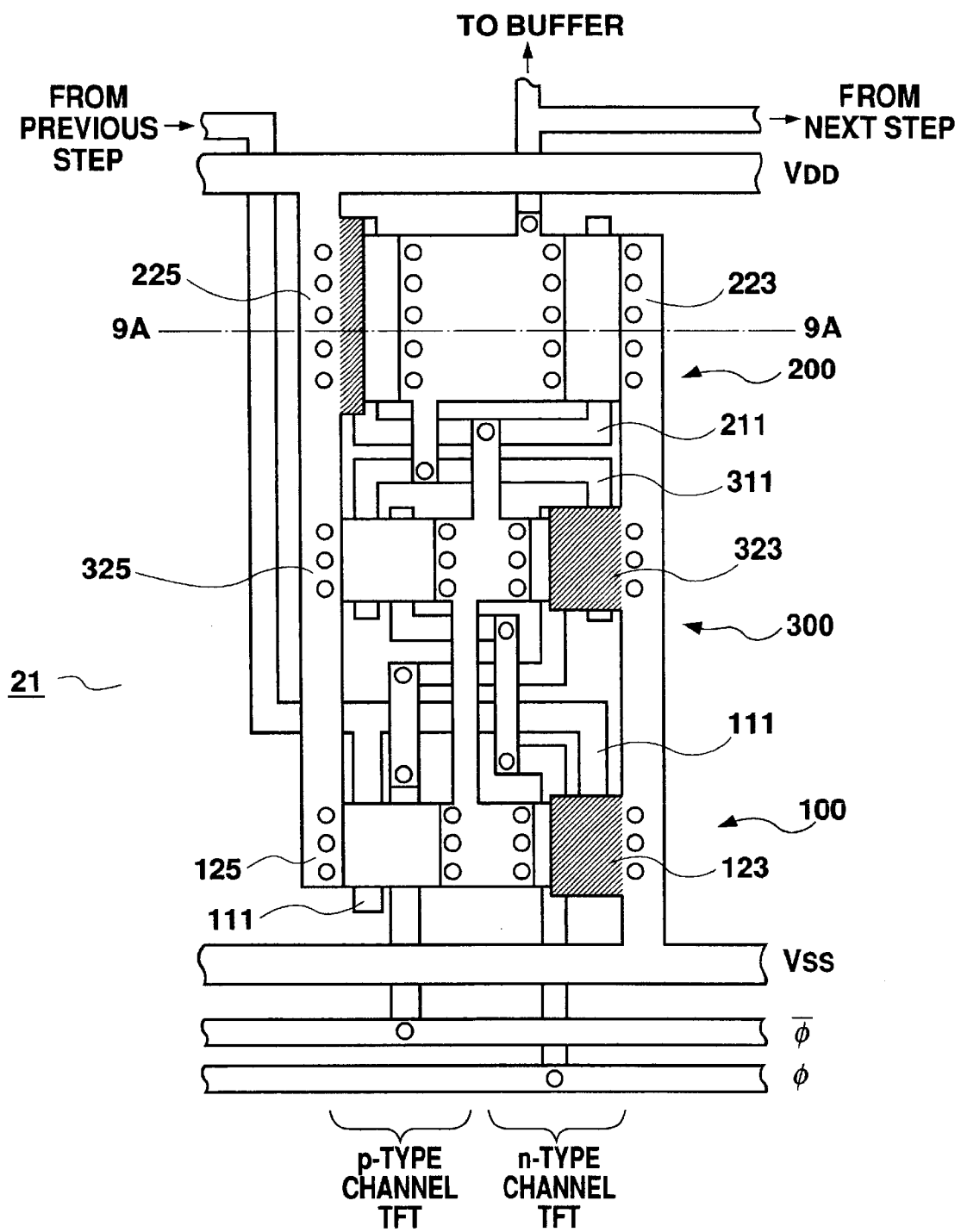
FIG. 9 is a diagram showing a TFT top plane configuration of a shift register according to the embodiment of the present invention.
Figure 10:
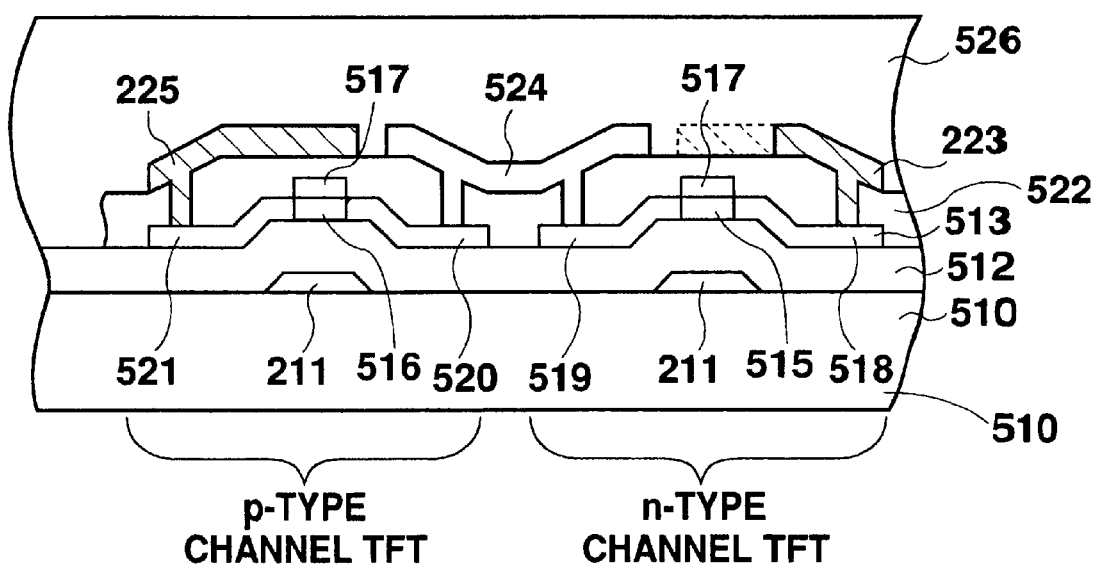
FIG. 10 is a diagram showing a TFT sectional configuration of the shift register taken along a line 9A–9A of FIG. 9.

FIG. 9 is a partial circuit diagram of the n-th shift register shown in FIG. 6. FIG. 10 is a sectional view taken along a line 9A—9A of FIG. 9. The timing chart of each signal is shown in FIG. 7.

As shown in the diagram, the shift register 21 comprises the clocked inverters 100 and 300 and the inverter 200, both of which have a CMOS structure having n-type and p-type channel TFTs. Clocks $\phi$ and $\bar{\phi}$ are fed to the clocked inverters 100 and 300. A voltage $V_{DD}$ is applied to source electrodes 125, 325 and 225 of the p-type channel TFTs of the clocked inverters 100, 300 and the inverter 200, whereas a voltage $V_{SS}$ is applied to source electrodes 123, 323 and 223 of the respective n-type channel TFTs. For example, the voltage $V_{DD}$ is 15 V and the voltage $V_{SS}$ is 0 V.

A signal Vn2 from the preceding shift register is fed to the gate electrode 111 of the clocked inverter 100. When the signal Vn2 goes high, the voltage $V_{SS}$ is selected, providing a signal Vn3 as its output to a gate electrode 211 of the inverter 200. In response to the signal Vn3, the inverter 200 selects the voltage VDD, which in turn is output to the subsequent shift register, buffer and a gate electrode 311 of the inverter 300.

In this embodiment, as shown in FIGS. 9 and 10, source electrodes 123 and 323 at the voltage $V_{SS}$ are provided respectively over the channel of the n-type channel TFT having the gate electrode 111 chiefly receiving a signal Vn2 at a relative low voltage L and over the channel of the n-type channel TFT having the gate electrode 311 chiefly receiving a signal Vn4 at a relatively low voltage L.

A source electrode 225 receiving the voltage $V_{DD}$ is also provided over the channel of the p-type channel TFT having the gate electrode 211 chiefly receiving a signal Vn3 at a relatively high voltage H.

Thus, in the same manner as the first embodiment, it is possible to suppress a variation in characteristic arising from to the supply of power to the inverter and clocked inverter having n-type and p-type channel TFTs.

This results in no variation in the TFT threshold voltage, so that each signal can be stably and accurately supplied to the display region without causing any variation in timing of pulse signals which is attributable to the variation in the TFT threshold voltage, whereby a satisfactory display is obtained. Further, by virtue of suppression of the variation in the TFT threshold voltage, an increase in the current consumption can be prevented.

It is preferred in the present invention that the source electrode to be provided over the channel cover the entire channel corresponding region over the channel, although the effect of the present invention can be ensured even if it covers only a part thereof. In the embodiment set forth hereinabove, description has been made of the TFT having the source electrode which extends over the channel correspondingly to the voltage level mainly applied to the gate electrode (major level during the application of voltage, in particular the voltage for making the TFT off). In the case of a circuit which receives a minor voltage, i.e., a voltage tending to subject the TFT characteristic to a variation during only a short period of time, which may cause a slight variation in the threshold, the present invention assures an effect that a more secure suppression of the TFT threshold variation is achieved by forming the source electrode in such a manner as to be superposed over the channel region in all the TFTs constituting the drive circuit.

Although in the above embodiments, description has been given of the case of a so-called bottom gate type TFT having its gate electrode which is disposed under the active layer, in other words, which is provided on the side of the substrate, the present invention is not intended to be limited thereto, but is applicable also to the case of a so-called top gate type TFT having its gate electrode disposed over the active layer. In this case as well, similar effects to the case of the bottom gate type TFT is attained.

Figure 11A:
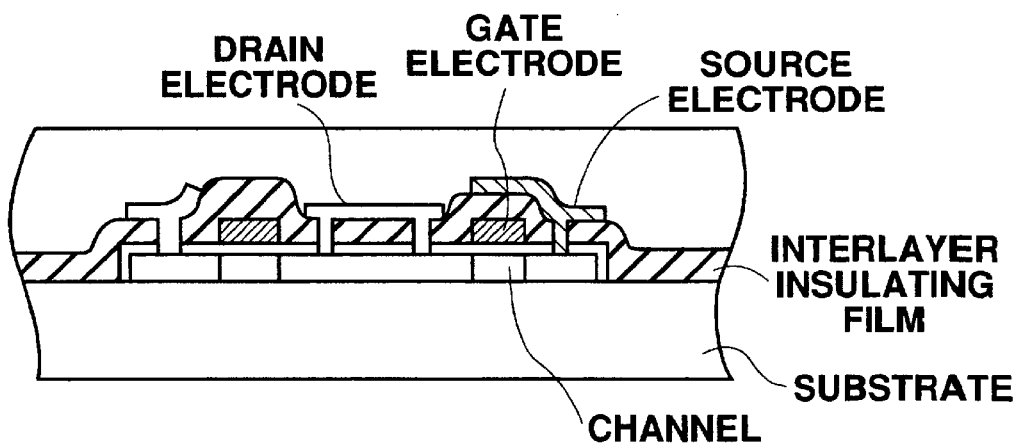
FIG. 11A is a diagram showing a TFT sectional structure in a buffer circuit or a shift register in a case of employing a top gate type thin film transistor.
Figure 11B:
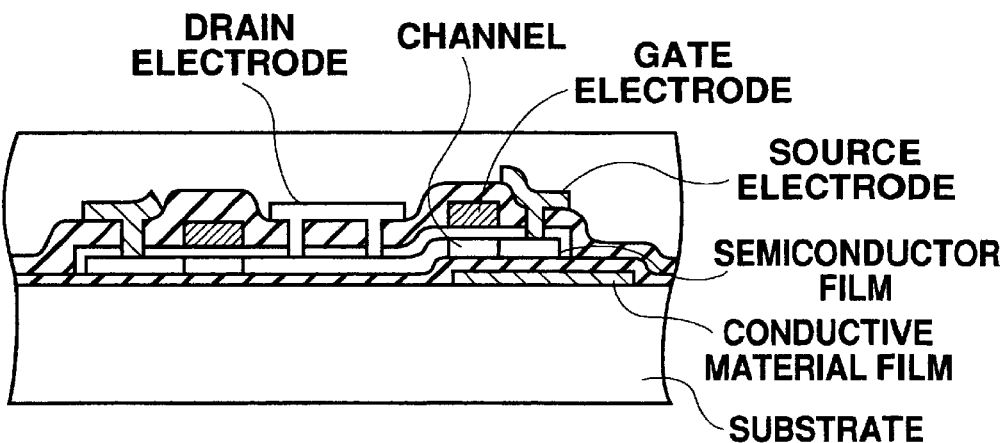
FIG. 11B is a diagram showing another TFT sectional structure different from FIG. 11A in a case of the top gate type thin film transistor.

In such a case, the top gate type TFT is configured such that the source electrode further covers the top of the gate electrode positioned over the channel as shown in FIG. 11A. In the case of the top gate type TFT, due to the presence of the gate electrode, little or no problem occurs above the channel region of the semiconductor film, but a back channel may possibly form on the side of the insulating substrate of the semiconductor film. Thus, as shown in FIG. 11B, it is preferable to employ a configuration in which an electrically conductive material having the same potential as the source electrode is interposed between the substrate and the semiconductor film, with a patterning of this material film overlapping at least the channel of the semiconductor film with the insulating film sandwiched therebetween. Note that this case leads to addition of the conductive material film forming step and the patterning step.

Figure 12:
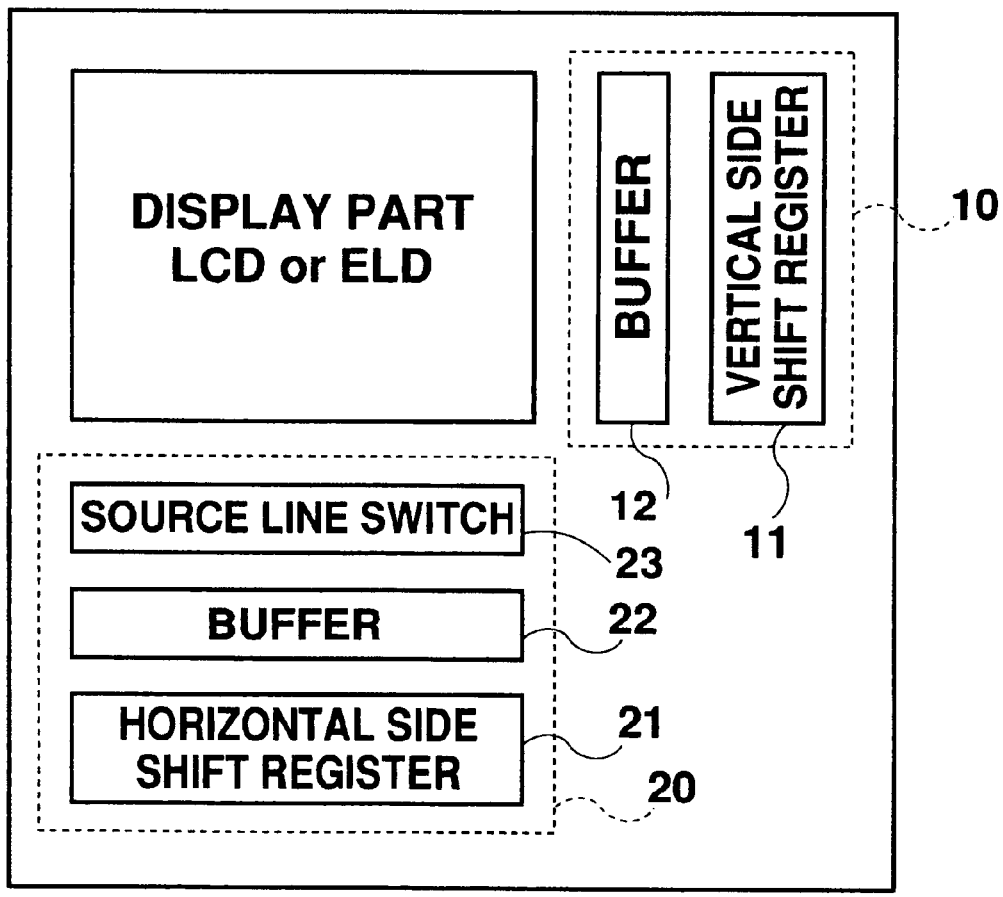
FIG. 12 is a diagram showing a structure of the liquid crystal display or an EL display of the present invention.

Furthermore, in the above embodiments, description has been given of the example employing a configuration in which the source electrode overlaps the TFT channel region, as the configuration of the thin-film transistor of the drive circuit, in particular, of the thin film transistor of the drive circuit formed on the same substrate as the LCD display. However, the present invention is not limited to this, and the above TFT structure is otherwise applicable to the configuration of the drive circuit of the organic EL display or the like (see FIG. 12). More specifically, the above configuration in which the source electrode overlaps the channel is applicable to the drive circuit for driving the organic EL display part, in particular, to the drive circuit which is formed on the same substrate as that display. Such a configuration makes it possible to prevent any variation in characteristic of the thin-film transistor in the drive circuit in the same manner as the case of the LCD.

What is claimed is:

1. A thin film transistor comprising, on an insulating substrate, a gate electrode, a gate insulating film, a semiconductor film provided with an n-type channel and a source and a drain, an interlayer insulating film, a first electrode connected to said source of said semiconductor film, a second electrode to which a higher voltage than a voltage applied to said first electrode is applied and which is connected to said drain of said semiconductor film, and a planarization insulating film, said first electrode being extended in such a manner as to overlap at least said n-type channel, wherein said thin film transistor is formed in a periphery of a display section and is provided in a drive circuit for driving a pixel thin film transistor in the display section.

2. The thin film transistor according to claim 1, wherein a source electrode voltage $V_{SS}$ is applied to said gate electrode.

3. The thin film transistor according to claim 1, wherein a voltage in which the thin film transistor is switched off is applied to said gate electrode.

4. A display comprising:

a drive circuit is formed in a periphery of a display section and is provided for driving a pixel thin film transistor in the display section, said drive circuit includes a thin film transistor, said thin film transistor including, on an insulating substrate, a gate electrode, a gate insulating film, a semiconductor film provided with an n-type channel and a source and a drain, an interlayer insulating film, a first electrode connected to said source of said semiconductor film, a second electrode to which a higher voltage than a voltage applied to said first electrode is applied and which is connected to said drain of said semiconductor film, and a planarization insulating film, said first electrode being extended in such a manner as to overlap at least said n-type channel.

5. A thin film transistor comprising, on an insulating substrate, a gate electrode, a gate insulating film, a semiconductor film provided with a p-type channel and a source and a drain, an interlayer insulating film, a first electrode connected to the drain of said semiconductor film, a second electrode to which a higher voltage than a voltage applied to said first electrode is applied and which is connected to the source of said semiconductor film, and a planarization insulating film, said second electrode being extended in such a manner as to overlap at least said p-type channel, wherein said thin film transistor is formed in a periphery of a display section and is provided in a drive circuit for driving a pixel thin film transistor in the display section.

6. The thin film transistor according to claim 5, wherein a source electrode voltage $V_{DD}$ is applied to said gate electrode.

7. The thin film transistor according to claim 5, wherein a voltage in which the thin film transistor is switched off is applied to said gate electrode.

8. A display comprising:

a drive circuit is formed in a periphery of a display section and is provided for driving a pixel thin film transistor in the display section, said drive circuit includes a thin film transistor, said thin film transistor including, on an insulating substrate, a gate electrode, a gate insulating film, a semiconductor film provided with a p-type channel and a source and a drain, an interlayer insulating film, a first electrode connected to the drain of said semiconductor film, a second electrode to which a higher voltage than a voltage applied to said first electrode is applied and which is connected to the source of said semiconductor film, and a planarization insulating film, said second electrode being extended in such a manner as to overlap at least said p-type channel.

9. A thin film transistor comprising a gate electrode, a gate insulating film, a semiconductor film provided with a channel and a source and a drain, an interlayer insulating film, a source electrode connected to said source, and a drain electrode connected to said drain, said source electrode being extended in such a manner as to overlap a channel formation position, wherein said thin film transistor is formed in a periphery of a display section and is provided in a drive circuit for driving a pixel thin film transistor in the display section.

10. The thin film transistor according to claim 9, wherein said channel is an n-type channel, and a source electrode voltage $V_{SS}$ acting as an off voltage is applied to said gate electrode.

11. The thin film transistor according to claim 9, wherein said channel is a p-type channel, and a source electrode voltage $V_{DD}$ acting as an off voltage is applied to said gate electrode.

12. The thin film transistor according to claim 9, wherein said gate electrode, said gate insulating film, said semiconductor film and said interlayer insulating film are formed in this order on a substrate;

the source of said semiconductor film and said source electrode are connected to each other via contact holes formed at predetermined positions on said interlayer insulating film; the drain of said semiconductor film and said drain electrode are connected to each other; and said source electrode extends over a position covering the top of said channel of said interlayer insulating film.

13. The thin film transistor according to claim 12, wherein a planarization insulating film for planarization the surface is formed so as to cover said interlayer insulating film, said source electrode and said drain electrode.

14. The thin film transistor according to claim 9, wherein said semiconductor film, said gate insulating film, said gate electrode and said interlayer insulating film are formed in this order on a substrate;

the source of said semiconductor film and said source electrode are connected to each other via contact holes formed at predetermined positions on said interlayer insulating film and said gate insulating film; the drain of said semiconductor film and said drain electrode are connected to each other; and said source electrode extends over a position covering the top of said channel of said interlayer insulating film.

15. The thin film transistor according to claim 14, wherein a planarization insulating film for planarization the surface is formed so as to cover said interlayer insulating film, said source electrode and said drain electrode.

16. The thin film transistor according to claim 9, wherein said channel is an n-type channel, and a voltage in which the thin film transistor is switched off is applied to said gate electrode.

17. The thin film transistor according to claim 9, wherein said channel is a p-type channel, and a voltage in which the thin film transistor is switched off is applied to said gate electrode.

18. A display comprising:

a drive circuit is formed in a periphery of a display section and is provided for driving a pixel thin film transistor in the display section, said drive circuit includes a thin film transistor, said thin film transistor including a gate electrode, a gate insulating film, a semiconductor film provided with a channel and a source and a drain, an interlayer insulating film, a source electrode connected to said source, and a drain electrode connected to said drain, said source electrode being extended in such a manner as to overlap a channel formation position.

19. A circuit comprising an n-type thin film transistor and a p-type thin film transistor, said n-type thin film transistor including a gate electrode, a gate insulating film, a semiconductor film provided with an n-type channel and a source and a drain, an interlayer insulating film, a source electrode connected to said source, and a drain electrode connected to said drain, said p-type thin film transistor including a gate electrode, a gate insulating film, a semiconductor film provided with a p-type channel and a source and a drain, an interlayer insulating film, a source electrode connected to said source, and a drain electrode connected to said drain, wherein said n-type thin film transistor and said p-type thin film transistor provide a complementary connection structure in which said n-type and p-type thin film transistor share said gate electrode and said drain electrode, with respective source electrodes being connected to different power sources, and said source electrode of that one of said n-type thin film transistor and said p-type thin film transistor that is subjected to an off voltage, as a voltage applied to said shared gate electrode, for turning that transistor off, said source electrode is extended in such a manner as to overlap a channel formation region of the corresponding thin film transistor, wherein said thin film transistors have a CMOS structure, are formed in a periphery of a display section, and are provided in a drive circuit for driving a pixel thin film transistor in the display section.

20. The circuit according to claim 19, wherein each of said n-type thin film transistor and said p-type thin film transistor is a bottom gate type thin film transistor in which said gate electrode, said gate insulating film, said semiconductor film and said interlayer insulating film are formed in this order on the insulating substrate;

the source of said semiconductor film and said source electrode are connected to each other via contact holes formed at predetermined positions on said interlayer insulating film; and the drain of said semiconductor film and said drain electrode are connected to each other.

21. The circuit according to claim 20, wherein a planarization insulating film for planarization the surface is formed so as to cover said interlayer insulating films of said n-type thin film transistor and said p-type thin film transistor, said source electrode and said drain electrode.

22. The circuit according to claim 19, wherein each of said n-type thin film transistor and said p-type thin film transistor is a top gate type thin film transistor in which said semiconductor film, said gate insulating film, said gate electrode and said interlayer insulating film are formed in this order on the insulating substrate;

the source of said semiconductor film and said source electrode are connected to each other via contact holes formed at predetermined positions on said interlayer insulating film and said gate insulating film; and the drain of said semiconductor film and said drain electrode are connected to each other.

23. A display that controls a plurality of pixel arranged in a matrix manner to carry out display, the display comprising:

a circuit includes an n-type thin film transistor and a p-type thin film transistor, said n-type thin film transistor including a gate electrode, a gate insulating film, a semiconductor film provided with an n-type channel and a source and a drain, an interlayer insulating film, a source electrode connected to said source, and a drain electrode connected to said drain, said p-type thin film transistor including a gate electrode, a gate insulating film, a semiconductor film provided with a p-type channel and a source and a drain, an interlayer insulating film, a source electrode connected to said source, and a drain electrode connected to said drain, wherein said n-type thin film transistor and said p-type thin film transistor provide a complementary connection structure in which said n-type and p-type thin film transistor share said gate electrode and said drain electrode, with respective source electrodes being connected to different power sources, and said source electrode of that one of said n-type thin film transistor and said p-type thin film transistor that is subjected to an off voltage, as a voltage applied to said shared gate electrode, for turning that transistor off is extended in such a manner as to overlap a channel formation region of the corresponding thin film transistor, wherein said thin film transistors have a CMOS structure, are formed in a periphery of a display section, and are provided in a drive circuit for driving a pixel thin film transistor in the display section.

* * * * *